United States Patent [19]

Park

[11] Patent Number: 5,509,995
[45] Date of Patent: Apr. 23, 1996

[54] PROCESS FOR ANISOTROPICALLY ETCHING SEMICONDUCTOR MATERIAL

[75] Inventor: Hae S. Park, Kyoungki, Rep. of Korea

[73] Assignee: Hyundai Electronics Industries Co. Ltd., Kyoungki, Rep. of Korea

[21] Appl. No.: 248,754

[22] Filed: May 25, 1994

[30] Foreign Application Priority Data

May 26, 1993 [KR] Rep. of Korea ............... 93-09164

[51] Int. Cl.$^6$ ................................. H01L 21/306
[52] U.S. Cl. ............ 156/643.1; 156/651.1; 156/657.1; 156/659.11; 216/67
[58] Field of Search ................ 156/643, 651, 156/657, 659.11, 662; 204/192.32, 192.37; 216/67, 68, 69

[56] References Cited

U.S. PATENT DOCUMENTS

| | | | |
|---|---|---|---|
| 4,460,435 | 7/1984 | Maa | 156/651 X |
| 4,487,652 | 12/1984 | Almgren | 156/643 |
| 4,676,869 | 6/1987 | Lee et al. | 156/651 X |
| 4,889,588 | 12/1989 | Fior | 156/643 |
| 5,236,549 | 8/1993 | Shirakawa et al. | 156/651 |

*Primary Examiner*—William Powell
*Attorney, Agent, or Firm*—Morgan & Finnegan

[57] ABSTRACT

A process of anisotropically etching a semiconductor material, capable of preventing contamination of the semiconductor material and thereby improving the yield of a semiconductor integrated circuit finally fabricated. The process includes a primary etching step of slantly etching a semiconductor layer, formed to be interposed between a lower layer and a photoresist pattern on a semiconductor substrate and partially exposed by the photoresist pattern, at a predetermined angle by using a primary plasma gas ionized by an electric field, thereby selectively exposing the lower layer, and a secondary etching step of directly applying a secondary plasma gas ionized by the electric field to sloped surfaces of the semiconductor layer formed at the primary etching step and scattering the secondary plasma gas toward the sloped surfaces of the semiconductor layer by the exposed portion of the lower layer, whereby the sloped surfaces of the semiconductor layer is vertically etched.

5 Claims, 2 Drawing Sheets

PROCESS FOR ANISOTROPICALLY ETCHING SEMICONDUCTOR MATERIAL

BACKGROUND OF THE INVENTION

1. Field of the Invention

The present invention relates to a process for vertically etching a semiconductor material in fabrication of a semiconductor integrated circuit, and more particularly to a process of anisotropically etching a semiconductor material, capable of preventing contamination of the semiconductor material and thereby improving the yield of a semiconductor integrated circuit finally fabricated.

2. Description of the Prior Art

In accordance with well-known anisotropic etch processes, an electric field and a plasma gas are applied to a semiconductor material such as silicon or polysilicon containing silicon in a sealed chamber, thereby causing the semiconductor material to be vertically etched. The electric field serves to ionize the plasma gas. The ionized plasma gas reacts with atoms of the semiconductor material, thereby producing a volatile compound. This volatile compound is discharged out of the sealed chamber by a vacuum pump.

The plasma gas contains a polymerizing factor serving to produce a polymer by itself or by its reaction with a photoresist film formed over the semiconductor material. The polymer produced by the polymerizing factor is deposited on the upper surface and side walls of the photoresist film, and the side walls and etched surface of the semiconductor material, thereby preventing the semiconductor material from being horizontally etched. This is because the polymer deposited on the side walls of the semiconductor material is left upon the etching, by virtue of the ionized plasma gas.

However, the polymer deposited on the side walls of the semiconductor material still remains after completion of the etching. As a result, the remaining polymer serves as a contaminant. Furthermore, removal of such a polymer is hardly accomplished in case of a semiconductor integrated circuit, in particular having a very small electrode width and wiring width. Due to the remaining polymer, the yield of a semiconductor integrated circuit is decreased. Now, the above-mentioned problems encountered in the contentional anisotropic etch process will be described, in conjunction with FIGS. 1A to 1D.

FIGS. 1A to 1D are sectional views respectively illustrating sequential steps of the conventional anisotropic etch process.

In accordance with the process, first a polysilicon layer 2 is deposited over a lower layer 1 comprised of an oxide layer, as shown in FIG. 1A. On the polysilicon layer 2, a photoresist pattern 3 is formed. The formation of photoresist patter 3 is achieved by coating a photoresist film over the polysilicon layer 2, exposing the photoresist film to a light by using a mask, and then developing the light-exposed photoresist film.

Under a condition that the photoresist pattern 3 is used as a mask, the polysilicon layer 2 is subjected to etching by utilizing a plasma gas ionized by an electric field. The exposed portion of polysilicon layer 2 reacts with the ionized plasma gas, so that it may be etched, as shown in FIG. 1B. In the process of etching, a polymer 4 is deposited on the side walls of the etched polysilicon layer 2, the target surface of polysilicon layer 2 to be etched, and the upper surface and side walls of the photoresist pattern 3. This polymer 4 is produced by a polymerizing factor contained in the plasma gas or by a reaction of the polymerizing factor with atoms of the photoresist pattern 4.

The portion of polymer 4 deposited on the upper surface of photoresist pattern 3 and the target etched surface of polysilicon layer 2 is removed by the ionized plasma gas, as shown in FIG. 1C. As a result, the target etched surface of polysilicon layer 2 is exposed. However, the portion of polymer 4 deposited on the side walls of photoresist pattern 3 and the side walls of polysilicon layer 2 is hardly removed by the ionized plasma gas. This is because the ionized plasma gas has no vertical orientation characteristic.

Thereafter, the exposed target etched surface of polysilicon layer 2 is completely removed by the ionized plasma gas, thereby partially exposing the lower layer 1. At the side walls of the etched polysilicon layer 2, however, the polymer 4 is still left without being removed by the ionized plasma gas. The remaining polymer 4 is chemically changed at the subsequent steps involving a heat treatment and chemical treatment. This results in a variation in conduction characteristics of polysilicon and a variation in insulation characteristics of a second oxide film to be subsequently coated over the lower layer 1. Due to such variations, the yield of a semiconductor integrated circuit finally fabricated is decreased. At a higher integration degree, the yield of a semiconductor integrated circuit is abruptly decreased.

SUMMARY OF THE INVENTION

Therefore, an object of the invention is to provide a process of anisotropically etching a semiconductor material, capable of preventing contamination of the semiconductor material upon etching and thereby improving the yield of a semiconductor integrated circuit finally fabricated.

In accordance with the present invention, this object can be accomplished by providing a process of anisotropically etching a semiconductor layer formed to be interposed between a lower layer and a photoresist pattern on a semiconductor substrate, and partially exposed by the photoresist pattern, comprising: a primary etching step of slantly etching the exposed portion of the semiconductor layer at a predetermined angle by using a primary plasma gas ionized by an electric field, thereby selectively exposing the lower layer; and a secondary etching step of directly applying a secondary plasma gas ionized by the electric field to sloped surfaces of the semiconductor layer formed at the primary etching step and scattering the secondary plasma gas toward the sloped surfaces of the semiconductor layer by the exposed portion of the lower layer, whereby the sloped surfaces of the semiconductor layer is vertically etched.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

FIGS. 2A to 2D are sectional views respectively illustrating a process for anisotropically etching a semiconductor material in accordance with the present invention.

Figure 1A:
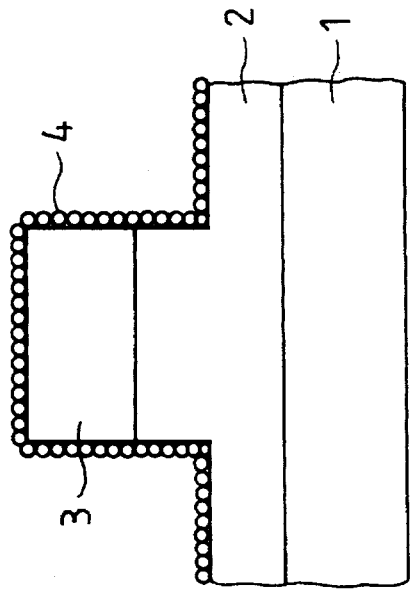
FIGS. 1A to 1D are sectional views respectively illustrating sequential steps of a conventional process for anisotropically etching a semiconductor material.
Figure 1B:
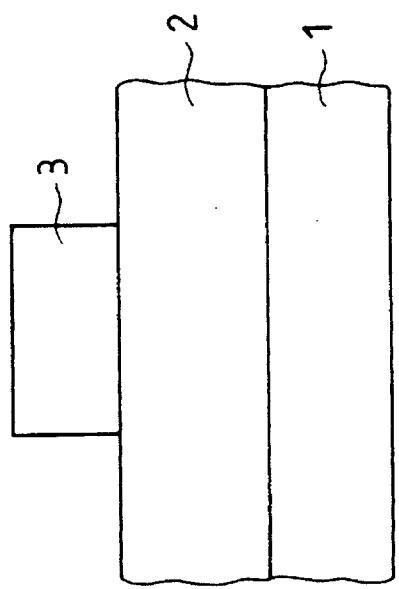
Figure 1C:
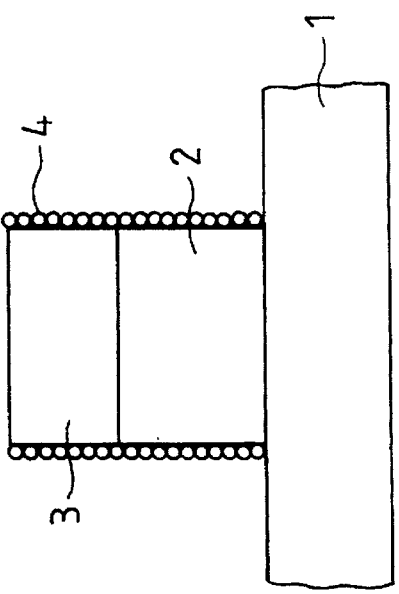
Figure 1D:
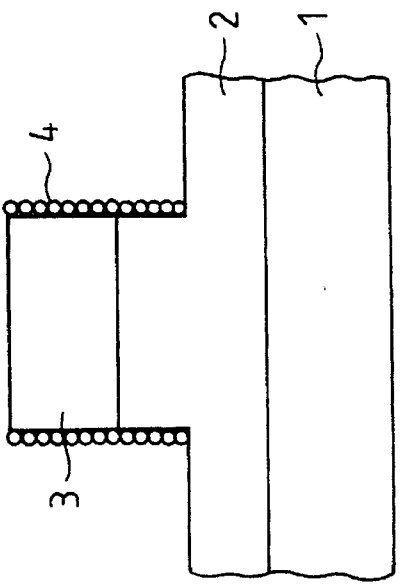
Figure 2A:
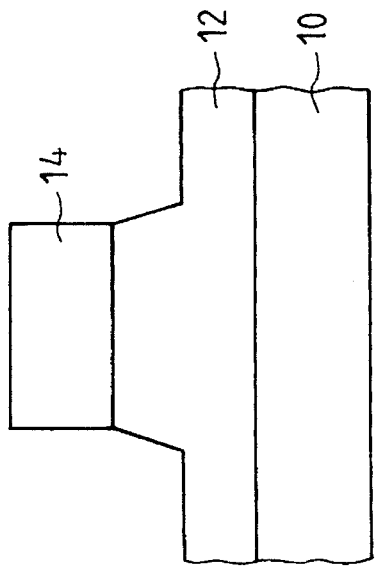
FIGS. 2A to 2D are sectional views respectively illustrating sequential steps of a process for anisotropically etching a semiconductor material in accordance with the present invention.

In accordance with this method, first, a polysilicon layer 12 is formed over a lower layer 10 comprised of an oxide layer, as shown in FIG. 2A. On the polysilicon layer 12, a photoresist pattern 14 is formed. The lower layer 10 is formed over a semiconductor substrate (not shown). The polysilicon layer 12 is a target thin film to be etched. The formation of polysilicon layer 12 is achieved by depositing polysilicon over the lower layer 10. The formation of photoresist pattern 14 is achieved by coating a photoresist film over the polysilicon layer 12, exposing the photoresist film to a light by using a mask, and then developing the light-exposed photoresist film. The polysilicon layer 12 is selectively exposed by the photoresist pattern 14.

Thereafter, the exposed portion of polysilicon layer 12 is subjected to etching by using a primary plasma gas and an electric field such that it is slantly etched at a positive angle of 50° to 70°. Upon etching, the primary plasma gas is ionized by the electric field. The ionized primary plasma gas reacts with atoms of the exposed polysilicon layer 12, thereby producing a volatile material which can be easily discharged out of a sealed chamber (not shown) wherein the etching step is carried out. The primary plasma gas consists of a mixture of $Cl_2$ gas and He gas. For achieving the etching, the $Cl_2$ gas and the He gas are used in a total amount of 500 SCCM or more. In order to obtain the positive slope of 50° to 70° at the profile of polysilicon layer 12 formed after the etching, the pressure of the primary plasma gas and the electric power of the electric field are set at 500 mT and 400 Watt, respectively. As the exposed polysilicon layer 12 is etched at the positive slope of 50° to 70° C., no polymer is deposited on the profile of polysilicon layer 12 formed after the etching. Although a polymer is deposited on the sloped profile of polysilicon layer 12, it is discomposed by the ionized plasma.

Figure 2B:
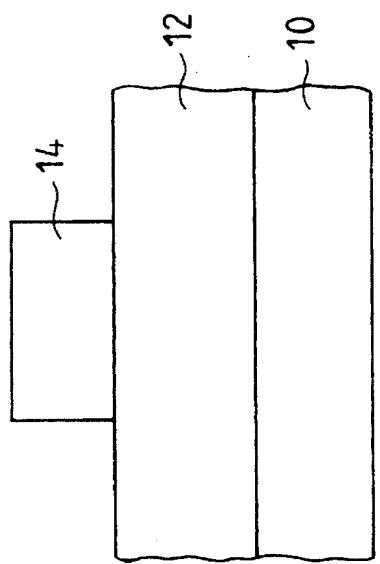
Figure 2C:
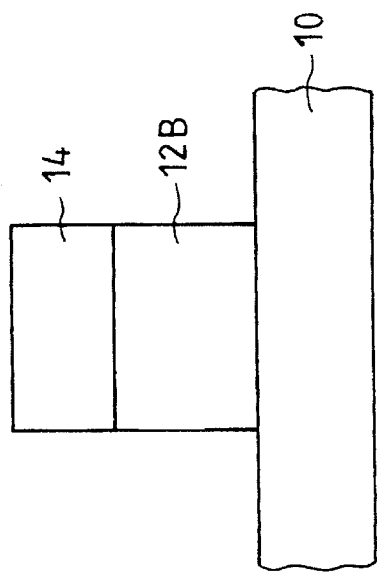

After completion of the etching shown in FIG. 2B, the exposed polysilicon layer 12 is completely removed. As a result, the first polysilicon pattern 12A is obtained which serves to selectively expose the lower layer 10. The first polysilicon pattern 12A has a profile involving the positive slope of 50° to 70°.

Figure 2D:
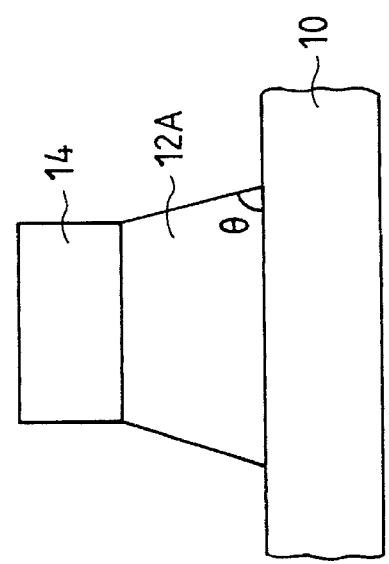

Thereafter, the first polysilicon pattern 12A is subjected at its sloped surfaces to an etching by using the second plasma gas and an electric field, thereby forming the second polysilicon pattern 12B, as shown in FIG. 2D. During the etching, the exposed portion of lower layer 10 serves to scatter the ionized second plasma gas toward the sloped surfaces of the first polysilicon pattern 12A so that the lower portion of each sloped surface of the first polysilicon pattern 12A can be etched at a higher rate than the upper portion. As a result, the second polysilicon pattern 12B has a vertical profile approximating to 90°. The second plasma gas scattered by the lower layer 10 serves to discompose a polymer being deposited on the sloped surfaces of the first polysilicon pattern 12A. As a result, no polymer is left at the vertical profile of the second polysilicon pattern 12B after completion of the etching. The second plasma gas may have the same composition as the first plasma gas. However, it is desirable that the second plasma gas consists of other materials than those of the first plasma gas.

As apparent from the above description, the present invention provides a process of anisotropically etching a semiconductor material, including the steps of primarily etching a polysilicon layer at a predetermined angle by using an ionized plasma, and secondarily etching the profile of the etched polysilicon layer by using a plasma gas being scattered by a portion of a lower layer exposed after the primary etching so as to form a vertical profile of the polysilicon layer. As the polysilicon layer is slantly etched and then vertically etched, no polymer is deposited on the profile of the polysilicon layer after etching. Accordingly, the process of the present invention provides advantages of preventing defects of semiconductor integrated circuits such as defects of silicon electrodes and wirings and defects of oxide films, and improving the yield of semiconductor integrated circuits.

Those skilled in the art will appreciate that the present invention may be employed for vertically etching not only silicon, but also silicon compounds and the like.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A process of anisotropically etching a semiconductor layer formed to be interposed between a layer and a photoresist pattern on a semiconductor substrate and partially exposed by the photoresist pattern, comprising:

a primary etching step of slantly etching the exposed portion of the semiconductor layer at an angle by using a primary plasma gas ionized by an electric field, thereby selectively exposing the lower layer; and a secondary etching step of directly applying a secondary plasma gas ionized by the electric field to sloped surfaces of the semiconductor layer formed at the primary etching step and scattering the secondary plasma gas toward the sloped surfaces of the semiconductor layer by the exposed portion of the lower layer, whereby the sloped surfaces of the semiconductor layer are vertically etched.

2. A process in accordance with claim 1, wherein each of the sloped surfaces of the semiconductor layer formed at the primary etching step has a slope of 50° to 70°.

3. A process in accordance with claim 2, wherein the ionized primary plasma gas contains $Cl_2$ gas and He gas and has a pressure of 500 mT, and the electric field ionizes the primary plasma gas by an electric power of not more than 400 Watt.

4. A process in accordance with claim 3, wherein the $Cl_2$ gas and the He gas have a total amount of not less than 500 SCCM.

5. A process in accordance with claim 1, wherein the ionized secondary plasma gas has a pressure of 300 mT and the electric field ionizes the secondary plasma gas by an electric power of not more than 150 Watt.

* * * * *